United States Patent
Shealy et al.

(10) Patent No.: US 7,250,360 B2
(45) Date of Patent: Jul. 31, 2007

(54) SINGLE STEP, HIGH TEMPERATURE NUCLEATION PROCESS FOR A LATTICE MISMATCHED SUBSTRATE

(75) Inventors: James R. Shealy, Ithaca, NY (US); Joseph A. Smart, Mooresville, NC (US)

(73) Assignee: Cornell Research Foundation, Inc., Ithaca, NY (US)

( * ) Notice: Subject to any disclaimer, the term of this patent is extended or adjusted under 35 U.S.C. 154(b) by 124 days.

(21) Appl. No.: 11/069,040

(22) Filed: Mar. 2, 2005

(65) Prior Publication Data
US 2006/0199364 A1 Sep. 7, 2006

(51) Int. Cl.
*H01L 21/28* (2006.01)
*H01L 21/3205* (2006.01)

(52) U.S. Cl. ...................... 438/603; 438/604; 438/607; 257/E21.097; 257/E21.108; 257/E21.112; 257/E21.118; 257/E21.126

(58) Field of Classification Search ................ 438/603, 438/604, 606, 608, 688, 660, 663, 341, 363, 438/416, 502, 913, 931, 933
See application file for complete search history.

(56) References Cited
U.S. PATENT DOCUMENTS 5,625,202 A * 4/1997 Chai ......................... 257/94
5,679,152 A * 10/1997 Tischler et al. ............... 117/97
5,834,379 A 11/1998 Shealy
5,909,036 A * 6/1999 Tanaka et al. ................ 257/94
6,177,292 B1 * 1/2001 Hong et al. .................... 438/46
6,218,280 B1 * 4/2001 Kryliouk et al. ............ 438/607
6,478,871 B1 11/2002 Shealy

* cited by examiner

*Primary Examiner*—David Nhu
(74) *Attorney, Agent, or Firm*—Jones, Tullar & Cooper PC

(57) ABSTRACT

A single step process for nucleation and subsequent epitaxial growth on a lattice mismatched substrate is achieved by pre-treating the substrate surface with at least one group III reactant or at least one group II reactant prior to the introduction of a group V reactant or a group VI reactant. The group III reactant or the group II reactant is introduced into a growth chamber at an elevated growth temperature to wet a substrate surface prior to any actual crystal growth. Once the pre-treatment of the surface is complete, a group V reactant or a group VI reactant is introduced to the growth chamber to commence the deposition of a nucleation layer. A buffer layer is then grown on the nucleation layer providing a surface upon which the epitaxial layer is grown preferably without changing the temperature within the chamber.

24 Claims, 1 Drawing Sheet

Figure 1:
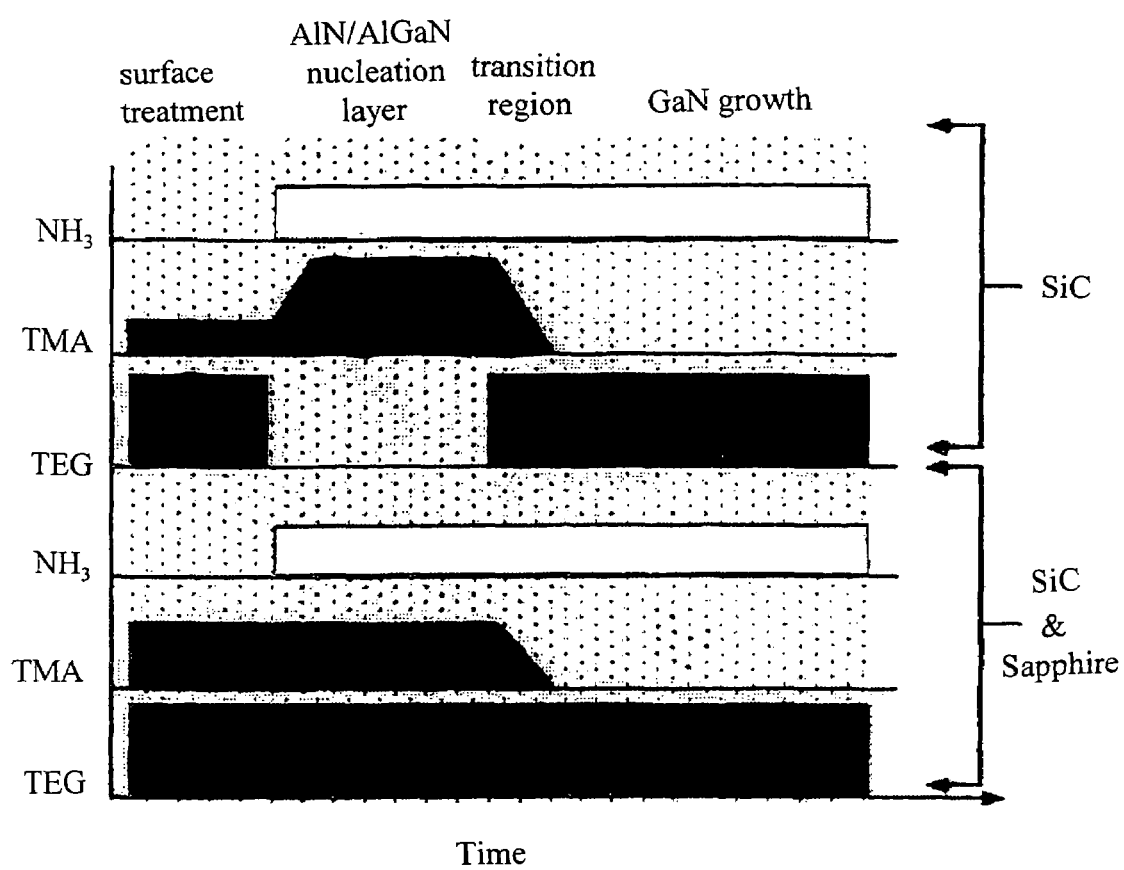

SINGLE STEP, HIGH TEMPERATURE NUCLEATION PROCESS FOR A LATTICE MISMATCHED SUBSTRATE

STATEMENT REGARDING FEDERALLY SPONSORED RESEARCH OR DEVELOPMENT

This invention was made with Governmental support from the Office of Naval Research under Contract No. N00014-96-1-1223 and DARPA under Contract No. DABT63-C95-0121. The Government has certain rights in the invention.

BACKGROUND ON THE INVENTION

1. Field of the Invention

The present invention relates to a single step process for the nucleation and subsequent epitaxial growth on a lattice mismatched substrate.

2. Description of Related Art

Heteroepitaxial growth of GaN and related alloys on severely mismatched substrates such as sapphire, SiC and silicon requires thin nucleation layers to provide nucleation sites to initiate crystal growth. When optimized, these nucleation layers accommodate the strain between the substrate and epitaxial layers caused by lattice and thermal mismatches, while still maintaining crystallographic registration of the epitaxial films to the substrate lattice structure. The most commonly accepted practice for nucleation of these substrates with GaN-based material utilizes a two-temperature process involving either one or two flow paths. In addition, different growth pressures are used on certain steps in the nucleation process. In this fashion, high structural and electrical quality epitaxial films can be realized in severely mismatched material systems.

BRIEF SUMMARY OF THE INVENTION

The present invention is a single step process for the nucleation and subsequent epitaxial growth on a lattice mismatched substrate. A nucleation layer and a buffer layer are formed on the lattice mismatched substrate prior to the formation of an epitaxial layer. The epitaxial layer preferably includes a III-V compound or a II-VI compound. Crystal growth can be carried out by any conventional means such as organometallic vapor phase epitaxy (OM-VPE), molecular beam epitaxy (MBE), or atomic layer epitaxy. The techniques for crystal growth preferably involve flow (beam) modulation, growth at atmospheric or reduced pressures, as well as various precursor chemistries that are widely accepted in the industrial and research communities.

In a preferred embodiment, a lattice mismatched substrate is pre-treated with a group III reactant or a group II reactant at an elevated growth temperature prior to the addition of a group V reactant or a group VI reactant and the growth of a nucleation layer. The group III reactant or the group II reactant is introduced into a growth chamber to pre-treat a surface of the substrate. Then, a nucleation layer is formed by introducing the group V reactant or the group VI reactant into the growth chamber. In a preferred embodiment, the nucleation layer is $Al_xGa_{1-x}N$ where x varies from 0 to 1. A buffer layer, preferably GaN, is formed on the nucleation layer to provide a surface upon which the epitaxial layer is grown. In a preferred embodiment, aluminum reacts with the surface of the substrate providing the needed nucleation sites while gallium prepares the aluminum saturated surface for subsequent growth of the epitaxial layer, preferably an epitaxial layer including AlN, AlGaN, or GaN.

The present single step process is a single flow, single pressure, high temperature process. The single step process involves a surface treatment prior to epitaxial growth that allows complete coalescence of the epitaxial film within the first 200 Å of growth. This single step process eliminates the large temperature ramps and complex flow requirements of the commonly used two-step nucleation technologies.

BRIEF DESCRIPTION OF THE DRAWING(S)

The features and advantages of the present invention will become apparent from the following detailed description of a preferred embodiment thereof, taken in conjunction with the accompanying drawings, in which:

FIG. 1 is a schematic representation of one embodiment of the single step nucleation process.

DETAILED DESCRIPTION OF THE INVENTION

The present invention is a single step process, preferably a single flow, single pressure, high temperature nucleation process. This single step process for nucleation and subsequent growth of an epitaxial layer on a lattice mismatched substrate is achieved by pre-treating a surface of the substrate with at least one group III reactant or at least one group II reactant prior to the introduction of a group V or a group VI reactant. The substrate is a mismatched substrate comprising a material that is lattice mismatched to an epitaxial layer to be grown thereon. Preferably, the mismatched substrate is silicon, sapphire or SiC. The reactants are generally selected from a group of compounds which are volatile near room temperature and can be vapor transported in a carrier gas. The group III reactant is preferably selected from the group consisting of a gallium reactant, an aluminum reactant, a boron reactant, and an indium reactant. Most preferably, the gallium reactant is triethylgallium (TEG) or trimethylgallium (TMG). Most preferably, the aluminum reactant is triethylaluminum (TEA) or trimethylaluminum (TMA). Most preferably, the boron reactant is triethylboron (TEB) or trimethylboron (TMB). Most preferably, the indium reactant is triethylindium (TEIn) or trimethylindium (TMIn). The group II reactant is preferably selected from the group consisting of a cadmium reactant and a zinc reactant. At least one group III reactant or at least one group II reactant is introduced into a growth chamber at an elevated growth temperature to pre-treat the surface of the substrate prior to any actual crystal growth. In a preferred embodiment, the elevated growth temperature is 900 to 1100° C. In a preferred embodiment, more than one group III reactant or more than one group II reactant is introduced into the growth chamber. For example, two group III reactants, preferably a gallium reactant and an aluminum reactant, may be introduced into the growth chamber. Once the pre-treatment is complete, the group V reactant or the group VI reactant is introduced to begin the growth of the nucleation layer. Preferably, the group V reactant contains a nitrogen reactant, an arsenic reactant or a phosphorus reactant. In one preferred embodiment, the group V reactant is a group V hydride, most preferably ammonia, arsine or phosphine. In a second preferred embodiment, the group V reactant is a group V organic precursor, most preferably tertiarybutylarsine (TBAs) or tertiarybutylphosphine (TBP). Preferably, the group VI reactant contains a tellurium reactant or a sulfur reactant. After the nucleation layer is formed, a buffer layer is formed on the nucleation layer. The buffer layer provides a surface upon which the epitaxial layer is grown. The epitaxial layer includes a III-V compound or a II-VI compound. Preferably, the III-V compound or the II-VI compound includes, but is not limited to, AlN, GaN, AlGaN, BGaN, BInN, BAlN, CdTe, and ZnS.

In a preferred embodiment, an $Al_xGa_{1-x}N$ nucleation layer where x varies from 0 to 1 is grown on a substrate. Generally, the aluminum content requirements increase from SiC, to sapphire, then to silicon for obtaining atomically flat two-dimensional epitaxial growth. In order to obtain the desired nucleation layer, the surface of the substrate is first cleaned with hydrogen near a growth temperature. The substrate is then subjected to the desired elevated growth temperature, preferably 900 to 1100° C. After the growth temperature has stabilized, an aluminum reactant and a gallium reactant are introduced into the growth chamber to pre-treat the surface of the substrate prior to the introduction of a nitrogen source and nucleation layer growth. The exposure time and flux of the aluminum reactant and the gallium reactant depend again on the substrate material and the crystal qualities desired. Once the pre-treatment of the surface is complete, a nitrogen source, preferably ammonia, is introduced into the growth chamber to commence the deposition of a nucleation layer. Preferably, the nucleation layer is grown at the same elevated growth temperature used to pre-treat the surface of the substrate. This provides a nucleation layer of crystalline $Al_xGa_{1-x}N$ of a specific thickness and aluminum content. In the case of an AlN nucleation layer, the gallium reactant is stopped prior to the formation of the nucleation layer and then re-introduced after the AlN nucleation layer is formed. After the nucleation layer is formed, a buffer layer is grown on the nucleation layer. Preferably, the buffer layer is grown at the same elevated growth temperature used to pre-treat the surface of the substrate. In the preferred embodiment, the aluminum reactant is ramped down and switched out resulting in a preferred GaN buffer layer. The buffer layer provides a surface upon which the epitaxial layer is grown. In a preferred embodiment, a GaN buffer layer provides a surface on which GaN-based materials can subsequently be deposited without changing the temperature within the chamber.

Numerous applications exist for a lattice mismatched substrate having an epitaxial nitride based material, such as (Al)GaN, in the areas of high power, high frequency electronics, short wavelength optoelectronics, biology, and micromachining technologies.

EXAMPLE 1

A schematic representation of a single step process for nucleation and subsequent growth of a preferred GaN-based material is shown in FIG. 1. Relative reactant fluxes and exposure cycles are depicted for the surface pre-treatment, the AlN/AlGaN nucleation layer, and the transition to GaN epitaxial growth on both sapphire and SiC substrates. For this example, flow modulation OMVPE is used for the growth.

A detailed description of the single step process depicted in FIG. 1 follows.
  1. The substrates are heated up to 1100° C. in hydrogen for 10 minutes to clean the surface of the substrate.
  2. After 10 minutes, the temperature is decreased to the growth temperature of 1040° C.
  3. After the temperature has stabilized, the aluminum reactant and the gallium reactant, preferably TEG and TMA, are introduced into the growth chamber. For sapphire substrates the TMA/TEG ratio is set at 0.15, while for SiC is fixed at 0.06. The substrates are exposed for 100 seconds.
  4. Ammonia is then switched into the growth chamber, forming $Al_xGa_{1-x}N$ (x=0.06 for SiC, and x=0.15 for sapphire) on the metal rich substrate surface. Around 20 nm of AlGaN is grown.
  5. The gallium reactant is switched into the growth chamber if not already present (in the case of an AlN nucleation layer).
  6. The aluminum reactant is then ramped down to 0.0 in 30 seconds, then switched out of the growth chamber.
  7. This results in GaN deposition, providing a buffer layer on which other GaN-based epitaxial layers can subsequently be deposited without any change in growth chamber temperature.

EXAMPLE 2

The following is an example of a high electron mobility transistor (HEMT) nucleation sequence in accordance with the present invention. TEG and TMA flows are total flows, not actual organometallic flux. Temperature calibrations with a clean cell indicated 1016° C. was actually more like 1040° C. The nucleation sequence is as follows:
  1. The substrate is heated in hydrogen to a temperature of approximately 1060° C. It generally takes about 14 minutes to ramp up from room temperature to approximately 1060° C. The RF is on at a lower power for the first 4 minutes.
  2. RF power is decreased to stabilize the substrate at the growth temperature of about 1016° C. It takes about 10 minutes from turning RF down to the start of growth, typically arriving at the growth temperature about 5 minutes before growth.
  3. An organometallic pre-treatment then begins, whereby TEG and TMA are switched into the cell to zone 1 for 100 sec for sapphire, 80 sec. for SiC in the absence of the nitrogen source. TEG flow is at 90 sccm and TMA flow is adjusted based on previous runs, typically 15-25 sccm for sapphire, 5-15 sccm for SiC. All procedures other than this step are the same for SiC and sapphire.
  4. TEG is switched out of the cell and ammonia is switched into zone 1 at approximately 4500 sccm, and the balance of hydrogen flow to zone 1 is switched out, all simultaneously. Immediately after (1-2 sec.), ammonia is switched into the block at 1200 sccm for distribution to the rest of the cell. This causes some pressure fluctuations due to the sudden change in ammonia flow, affecting all flows in to the cell, but primarily the ammonia flow. It typically takes 20-30s to stabilize.
  5. 60 sec. after ammonia is first switched in, TMA flow is increased from nucleation value to full AlN flow of about 90 sccm. This increase occurs somewhat slowly, over about 30 sec.
  6. Continue growing AlN for 20 min.
  7. Switch in TEG at full flow of approximately 90 sccm and simultaneously begin reducing TMA flow. Steadily decrease flow for 2 min. to zero and switch out.
  8. 30 sec. after TMA switched out, raise ammonia flow to GaN buffer value of about 9000 sccm to zone 1, and 2600 sccm to block. GaN buffer is now grown.

Although the present invention has been disclosed in terms of a preferred embodiment, it will be understood that numerous additional modifications and variations could be made thereto without departing from the scope of the invention as defined by the following claims.

What is claimed is:

1. A process for growing an epitaxial layer on a lattice mismatched substrate comprising the steps of:
   a) providing a substrate;
   b) pre-treating a surface of the substrate with at least one group III reactant or at least one group II reactant at an elevated growth temperature prior to introducing a group V reactant or a group VI reactant;
   c) introducing a group V reactant or a group VI reactant to grow a nucleation layer on the surface of the substrate; and
   d) growing a buffer layer on said nucleation layer, said buffer layer providing a surface upon which said epitaxial layer is grown.

2. The process of claim 1, wherein said substrate is selected from the group consisting of silicon, sapphire and SiC.

3. The process of claim 1, wherein said group III reactant is selected from the group consisting of a gallium reactant, an aluminum reactant, a boron reactant, and an indium reactant.

4. The process of claim 3, wherein said group III reactant is selected from the group consisting of triethyl gallium, trimethyl gallium, triethylaluminum, trimethyl aluminum, triethylboron, trimethylboron, triethylindium and trimethylindium.

5. The process of claim 1, wherein said group II reactant is a cadmium reactant or a zinc reactant.

6. The process of claim 1, wherein said step of pre-treating includes pre-treating the surface of the substrate with an aluminum reactant and a gallium reactant.

7. The process of claim 6, wherein said nucleation layer is AlN or AlGaN.

8. The process of claim 1, wherein said buffer layer is GaN.

9. The process of claim 1, wherein said epitaxial layer includes a compound selected from the group comprising AlN, GaN, AlGaN, BGaN, BInN, BAlN, CdTe, and ZnS.

10. The process of claim 1, further comprising the step of preheating said substrate in hydrogen prior to pre-treating the surface of the substrate with at least one group III reactant or at least one group II reactant.

11. The process of claim 1, wherein said elevated growth temperature is 900 to 1100° C.

12. The process of claim 11, wherein the step of introducing a group V reactant or a group VI reactant includes growing a nucleation layer at a growth temperature of 900 to 1100° C. and the step of growing a buffer layer includes growing a buffer layer at a growth temperature of 900 to 1100° C.

13. The process of claim 1, wherein said group V reactant is a group V hydride.

14. The process of claim 13, wherein said group V hydride is selected from the group consisting of ammonia, arsine, and phosphine.

15. The process of claim 1, wherein said group V reactant is a group V organic precursor.

16. The process of claim 15, wherein said group V organic precursor is tertiarybutylarsine or tertiarybutylphosphine.

17. The process of claim 1, wherein said group VI reactant is a tellurium reactant or a sulfur reactant.

18. A process for growing an epitaxial layer on a lattice mismatched substrate comprising the steps of:
   a) providing a substrate;
   b) pre-treating a surface of the substrate with at least a first group III reactant and a second group III reactant at a growth temperature of 900 to 1100° C. prior to introducing a nitrogen source;
   c) stopping a flow of the first group III reactant;
   d) introducing a nitrogen source to grow a nucleation layer on the surface of the substrate;
   e) resuming the flow of the first group III reactant and reducing a flow of the second group III reactant;
   f) stopping the flow of the second group III reactant; and
   g) growing a buffer layer on said nucleation layer, said buffer layer providing a surface upon which said epitaxial layer is grown.

19. The process of claim 18, wherein said first group III reactant is a gallium reactant and said second group III reactant is an aluminum reactant.

20. The process of claim 19, wherein said gallium reactant is triethylgallium and said aluminum reactant is trimethylaluminum.

21. The process of claim 18, wherein said nucleation layer is AlN or AlGaN.

22. The process of claim 18, wherein said buffer layer is GaN.

23. The process of claim 18, wherein said epitaxial layer includes a compound selected from the group comprising AlN, GaN, AlGaN, BGaN, BInN, and BAlN.

24. The process of claim 18, further comprising the step of preheating said substrate in hydrogen prior to pre-treating the surface of the substrate with the first group III reactant and the second group III reactant.

* * * * *